United States Patent [19]

van Tran

[11] Patent Number: 4,604,732
[45] Date of Patent: Aug. 5, 1986

[54] POWER SUPPLY DEPENDENT VOLTAGE REFERENCE CIRCUIT

[75] Inventor: Hiep van Tran, Carrollton, Tex.

[73] Assignee: Thomson Components-Mostek Corporation, Carrollton, Tex.

[21] Appl. No.: 614,619

[22] Filed: May 29, 1984

[51] Int. Cl.$^4$ ............................................. G11C 13/00
[52] U.S. Cl. .................................. 365/207; 365/226; 307/530
[58] Field of Search ............... 365/168, 189, 202, 203, 365/207, 226, 190, 210; 307/530

[56] References Cited

U.S. PATENT DOCUMENTS

| 3,656,117 | 4/1972 | Maley et al. | 365/168 |
| 4,202,044 | 5/1980 | Beilstein, Jr. et al. | 365/182 |
| 4,287,570 | 9/1981 | Stark | 365/104 |

Primary Examiner—Terrell W. Fears

[57] ABSTRACT

A circuit adapted for use in comparing voltages in a manner that is insensitive to power supply variations includes a pair of reference cells controlling the reference voltage of a sense amplifier through control of a pair of reference transistors and an input circuit for conditioning data having a matched input pair of transistors, so that input data will control the voltage on the input terminal of a sense amplifier in a manner such that both inputs to the sense amp track voltage, thermal and processing variations.

8 Claims, 3 Drawing Figures

POWER SUPPLY DEPENDENT VOLTAGE REFERENCE CIRCUIT

TECHNICAL FIELD

The field of the invention is that of integrated circuit memories, in particular memories where a cell stores more than one bit.

BACKGROUND ART

It is standard in the field of integrated circuit memories to use a sense amplifier that converts a small voltage swing on a bit line to a logic level signal for further processing. These sense amplifiers compare the voltage on the bit line with a reference voltage level in order to determine if the cell is storing a logical one or zero.

A simple form of voltage reference used in the prior art is a resistor divider chain between the power supply voltage and ground, but these dividers set up a low impedance path to ground that draws an amount of current that is unacceptably large for modern circuits.

The prior art has devoted considerable effort to making a reference voltage stable against variation in the power supply voltage, but when that is done in a situation in which the logical one is not the power supply voltage and/or the logical zero is not ground, the reference voltage may drift above or below the logical one or logical zero voltage values, respectively. It would be very useful in such memories, to have a trip voltage that would vary with the power supply voltage in the same manner as the logical one or logical zero voltage levels vary.

DISCLOSURE OF INVENTION

The invention relates to a voltage reference circuit combined with a conversion circuit for data stored in a memory cell to condition the data voltage for comparison with the reference.

The voltage reference circuit uses two dummy memory cells producing simulated data voltages above and below a desired comparison trip point. These voltages are applied to an identical parallel pair of transistors to compensate for processing and thermal variations in the circuit.

BEST MODE FOR CARRYING OUT THE INVENTION

Figure 1:
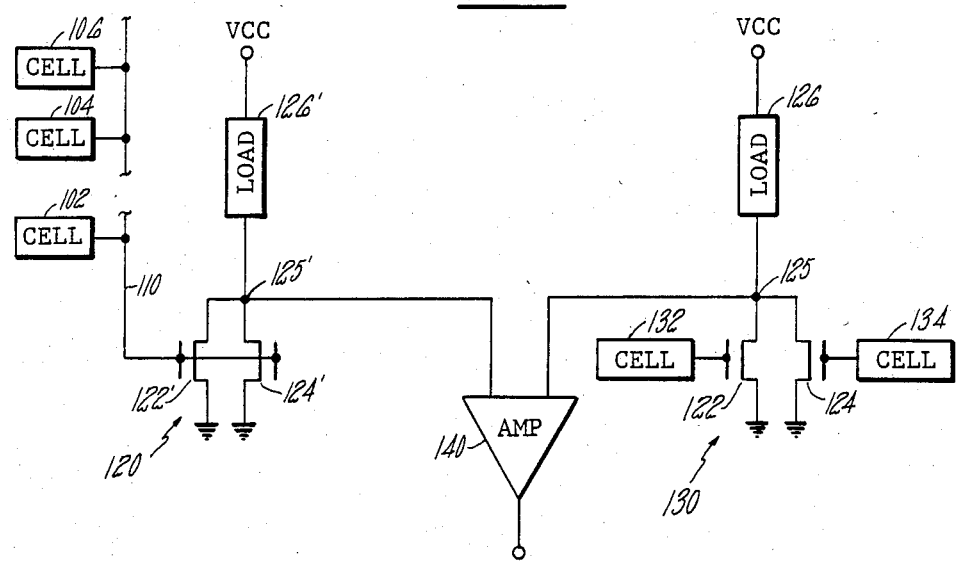
FIG. 1 illustrates a portion of a memory circuit comprising a sense amplifier together with a reference voltage circuit and a portion of a memory array.

In FIG. 1, a sense amplifier 140 has an input on the right-hand of the figure from a voltage reference circuit denoted generally by the number 130 that comprises a first and second transistor 122 and 124 respectively having gates controlled by dummy memory cells 132 and 134. Transistors 122 and 124 are connected in parallel between ground and node 125 that, in turn, is connected by load 126 to the power supply voltage Vcc. The voltage on node 125 is the reference voltage that will be compared with data voltage on node 125' on the left-hand side of the drawing.

In this section of the drawing, a voltage conditioning circuit denoted generally by the numeral 120 comprises corresponding transistors 122' and 124' that are connected from ground to node 125' which, in turn, is connected through load device 126' to Vcc. Transistors 122' and 124' have their gates tied together and are controlled by bit line 110, a portion of which is shown in the figure as being connected to memory cells 102, 104 and 106. One of these memory cells is selected by overhead circuitry that is not shown in the drawing to put out a stored voltage onto bit line 110. This voltage controls the turn-on of both transistors 122' and 124', and thus the voltage on node 125'.

In FIG. 1, memory cells 102 etc. store one bit with a lower voltage level denoted by a "0" and a higher voltage level denoted by a "1" representing the binary 0 and binary 1 states respectively. The "0" state will not be 0 volts, so that both transistors 122' and 124' will be turned on whether the data stored is a binary 1 or a binary 0. The voltage on node 125' will thus have two different voltage values, the lower voltage value corresponding to a logical one which turns on transistors 122' and 124' to a greater extent. Load device 126' may be a pull up transistor or a resistor.

In order to compensate for any processing variations that may be present, transistor 122' is matched exactly in size to transistor 122, transistor 124' is matched to transistor 124; and load devices 126 and 126' are also matched. Dummy cell 132 illustratively stores a logical one and dummy cell 134 illustratively stores a logical zero. These two voltages applied to the gates of transistors 122 and 124 respectively produce a certain degree of turn-on of transistors 122 and 124 and thus a reference voltage on node 125. This voltage reference will lie between the high and low voltages of the data, since it is generated by a combination of a logical one current and a logical zero current in parallel. In the particular case in which transistors 122' and 124' are matched in size, the voltage on node 125 will be halfway between the high and the low voltages corresponding to a logical one and a logical zero. Sense amplifier 140 will compare the intermediate reference voltage on node 125 with the data voltage on node 125'. Sense amplifier 140 is a conventional sense amplifier constructed, as known to those skilled in the art, such that when the data stored on a memory cell is a logical zero (so that node 125' has the higher voltage value) the output of sense amplifier of 140 is a logical zero. Conversely, when the data stored on memory cell 102 is a logical one, the voltage on node 125' is the lower voltage of the two values and the output of sense amplifier 140 is a logical one. Sense amplifier 140 is a conventional sense amplifier for purposes of discussing this figure.

An important advantage of this circuit is that the matching of the two input circuits 120 and 130 compensates for processing variations. Further, the input circuits only use one type of transistor, illustratively an N-channel enhancement MOSFET, which provides further assurance against errors caused by processing variations. As the voltage supply Vcc changes in time, the voltage stored in the memory cell will also change, but those changes are compensated for by the use of the dummy memory cells. Further, the voltages on nodes 125 and 125' will be affected by the change in Vcc, but that change is also canceled for the purposes of comparison by the matching of the transistors and the load devices. Thus, it will readily be appreciated by those skilled in the art that the intermediate reference voltage value on node 125 will maintain its relative position between the higher and lower voltage values of the stored data as they both change in response to changes in the power supply.

It is not necessary for the practice of the invention in its broadest form that the sizes of transistors 122 and 124 be the same. Changing the ratios of transistor sizes will move the reference voltage between the two extremes of the logical one voltage and the logical zero voltage.

Figure 2:
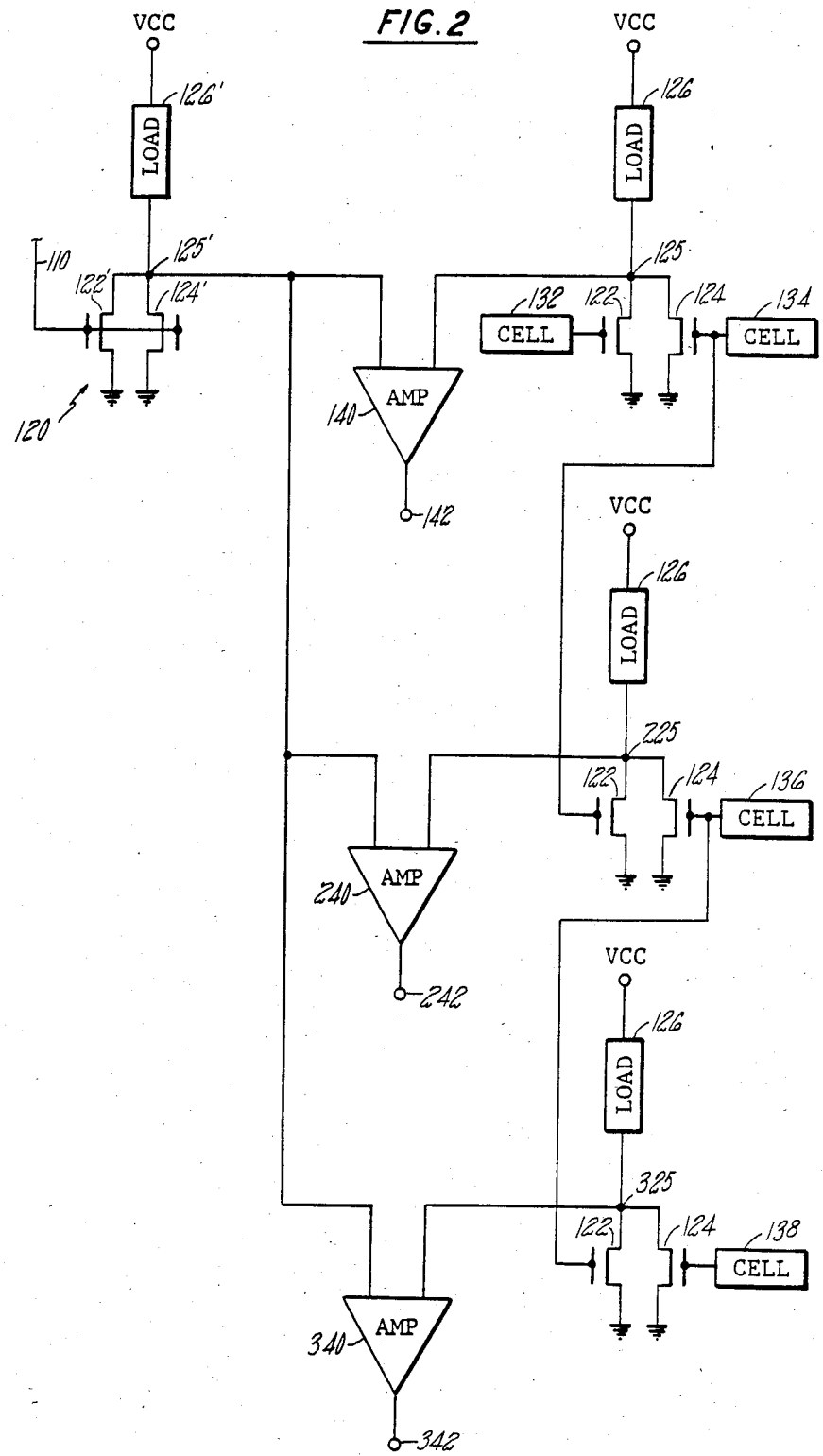
FIG. 2 illustrates an embodiment of the invention adapted for memory cells in which a single cell stores two bits of data.

This invention is especially well adapted to be used in high density memories in which each memory cell stores more than 1 bit. Referring now to FIG. 2, we see a sense amplifier set that is adapted to be used with a memory cell array in which each cell stores two bits of data. Such a cell is disclosed in U.S. Pat. No. 4,202,044. There will, of course, be four possible combinations of the two bits that may be stored in the memory cell and a corresponding set of four data voltages Vi stored in the cells are indicated on Table 1. Table 1 also indicates the output values (as "1" or "0") of the three sets of amplifiers 140, 240 and 340 for the different logical variations.

In the figure, bit line 110 enters input circuit 120 as before, but the output node 125' is now connected to three different sense amplifiers 140, 240 and 340. These sense amplifiers each have a different reference voltage taken from nodes 125, 225 and 325 respectively. In FIG. 2, elements that correspond to elements in FIG. 1 are indicated by the same numeral. In particular, dummy cell 132 holds a logical zero voltage of V0; cell 134 holds a logical voltage V1 which is distributed to both transistor 124 of the voltage reference circuit of sense amplifier 140 and also to transistor 122 of the voltage reference circuit of sense amplifier 240. In sense amplifier 240, the voltage reference is that which is intermediate between voltage V1 and V2. Therefore, the voltage V1 from dummy cell 134 is applied to both transistors 124 and 122 in order that exactly the same conditions be realized for the upper end of the first voltage range and the lower end of the second voltage range. Similarly, dummy cell 136 which stores the data voltage V2 is connected to transistor 124 of the reference circuit for sense amplifier 240 and to transistor 122 in the reference circuit for sense amplifier 340. Lastly, dummy cell 138 hold the highest data voltage V3 and is applied to the reference circuit for sense amplifier 340. The three voltage reference nodes 125, 225 and 325 therefore have stored in them corresponding intermediate trip point voltages that are respectively intermediate between the corresponding data voltage on node 125' that is produced by stored data in the selected cell that has one of the four values V0 through V3.

The data stored on the selected cell of memory array appears on bit line 110 and turns on transistors 122' and 124' of conditioning circuit 120 to produce a corresponding data voltage on node 125' that will have a value corresponding to one of the four different values of V0 through V3. Table 1 indicates the logic levels of the voltages of terminals 142, 242 and 342 for the different cases. It should be noted that in general the voltages V0, V1, V2 and V3 that are stored within the memory cells to represent the four different data configurations need not be evenly spaced in voltage amplitude. Similarly, the voltages on node 125' corresponding to voltages V0 through V3 and the trip point voltages need not be evenly spaced in voltage amplitude. Indeed, the voltages at the sense amplifier inputs need not be linearly related to the stored data. If transistors 122' or 124' are in the non-linear portion of the transistor characteristic curve, the voltage series on node 125' will not be linearly proportional to the stored data. This does not matter, because of the compensating effect of the dummy cells. The voltage on node 125' will be in one of four voltage states depending on the stored data and the voltage on node 125, 225 and 325 will be on corresponding trip point voltages that will swing as the power supply voltage changes.

It may be desired, in some cases, to have the set of voltages on node 125' be evenly spaced. In that case, a single conditioning circuit 120 would not be used but rather three conditioning circuits would be used, one for each sense amplifier, having different sized transistors that are sized, as is known in the art, to produce the desired values of voltages on node 125' etc.

Figure 3:
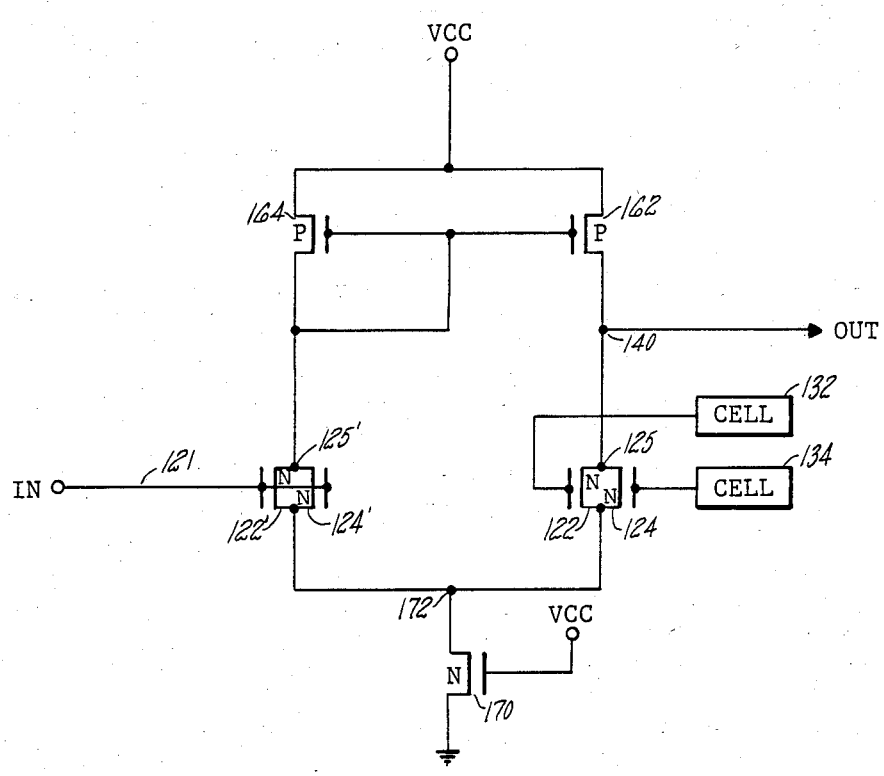
FIG. 3 illustrates an improved sense amplifier constructed according to the invention.

Referring now to FIG. 3, an improved sense amplifier incorporating the voltage reference system of the invention is illustrated, in which input line 121 controls the gates of N-channel transistors 122' and 124' to control the voltage on node 125, as before. On the right side of the drawing, dummy cells 132 and 134 control the voltages on N-channel transistors 122 and 124 as before. Transistor 170 is incorporated for use in biasing the voltages and is optional. The node 172 could be connected to ground instead of to transistor 170. The switching portion of the sense amplifier comprises P-channel transistors 164 and 162 connected to nodes 125 and 125' respectively. As is known in the art, a high voltage level on line 121, corresponding to a logical one, will drop the voltage on node 125, thereby forcing the output node to the power supply voltage Vcc. Similarly, a voltage on node 121 that is less than the trip point voltage will drive the voltage on node 125 up, turning off transistors 162 and 164 and permitting the output voltage on node 140 to approach the voltage on node 172, i.e. a lower output voltage. In the case where a logical zero is ground, node 172 will be connected to ground.

Those skilled in the art will readily be able to devise other amplifier output circuits that will put out desired values for a logical one or zero. Overhead circuitry for decoding the outputs of the several sense amplifiers and memory cell circuits for storing different voltage levels are conventional and are not part of the invention.

The embodiment of the invention illustrated herein employs CMOS technology, but the principles of the invention may be applied to NMOS or PMOS or to bipolar technology and the scope of the claims is not intended to be limited to the illustrated embodiment.

TABLE 1

| Data | VData | V142 | V242 | V242 |
|------|-------|------|------|------|
| 00 | V0 | "0" | "0" | "0" |
| 01 | V1 | "1" | "0" | "0" |
| 10 | V2 | "1" | "1" | "0" |
| 11 | V3 | "1" | "1" | "1" |

I claim:

1. A circuit for sensing a voltage state comprising:
a conditioning circuit responsive to an applied input data voltage for generating a conditioned data voltage on a conditioned input node;
a voltage reference circuit for generating a reference voltage on a reference node; and sensing means for comparing said conditioned data voltage and said reference voltage;

in which said voltage reference circuit comprises means for supplying current to a reference node and first and second reference transistors connected in parallel between said reference node and a second node, each of which first and second reference transistors has a gate controlled by first and second dummy memory cells having predetermined stored data, whereby the voltage of said reference node and the impedance of said first and second reference transistors between said reference node and said second node is dependent on said stored data;

in which said conditioning circuit comprises means for supplying current to a conditioned input node and a pair of corresponding first and second transistors, each of which is matched to one of said first and second reference transistors, which pair of corresponding transistors are connected in parallel between said conditioned input node and ground and both of which corresponding transistors have their gates connected to an input node, whereby an applied input data voltage produces a corresponding conditioned data voltage on said conditoned input node.

2. A circuit according to claim 1, in which said means for supplying current to said reference node and said means for supplying current to said conditioned input node each comprises a current path, having a predetermined impedance, between a supply voltage node and said conditioned input node or reference node.

3. A circuit according to claim 1, in which said first and second dummy memory cells impose first and second predetermined voltages on first and second controlled gates, one of said predetermined voltages representing a logic one and the other of said voltages representing a logic zero.

4. A circuit according to claim 3, in which both of said predetermined voltages are above the threshold voltage of the corresponding one of said first and second transistors, whereby both of said first and second transistors are turned on.

5. A circuit according to claim 1, in which each of said first and second dummy memory cells imposes first and second predetermined voltages representative of two out of a set of at least three data states.

6. A circuit for sensing one of at least three possible voltage states comprising:

at least one conditioning circuit responsive to an applied input data voltage for generating at least one conditioned data voltage on a conditioned node;

at least two voltage reference circuits for generating at least two reference voltages on at least two reference nodes; and at least one sensing means for comparing said conditioned data voltage with said at least two reference voltages; in which a first comparison means compares said conditioned output voltage with one of said at least two reference voltages to produce a first comparison signal; and a second comparison means compares said conditioned output voltage with another of said at least two reference voltages to produce a second comparison signal.

7. A circuit according to claim 6, in which a first one of said at least two voltage reference circuits comprises first and second parallel reference transistors controlled by first and second stored data voltages, said first and second parallel reference transistors comprising a current path having a predetermined impedance from a first one of said reference nodes to ground, thereby establishing a first reference voltage on said first reference node; and a second one of said at least two voltage reference circuits comprises third and fourth parallel reference transistors controlled by said second stored data voltage and a third stored data voltage respectively, said second stored data voltage being intermediate said first and third stored data voltages, said third and fourth parallel reference transistors comprising a current path having a predetermined impedance from a second one of said reference nodes to ground, thereby establishing a second reference voltage on said second reference node.

8. A circuit for sensing an input voltage comprising:

an input side comprising a first pull-up transistor connected between a supply voltage node and a gate node and an input pair of transistors connected between said gate node and a bias node connected to ground, both of the gates of said input transistors being controlled by said input voltage, whereby the impedance of said input side between said supply voltage node and said bias node is affected by said input voltage;

an output side comprising a second pull-up transistor connected between said supply voltage node and an output node, both pull-up transistors having their gates controlled by said gate node; and a pair of reference transistors connected in parallel between said output node and said bias node, said pair of reference transistors having their gates controlled by first and second reference cells storing first and second reference voltages, whereby said pair of reference transistors have a parallel impedance determined by said reference voltages.

* * * * *